United States Patent
Ahmed et al.

(10) Patent No.: US 10,126,967 B2
(45) Date of Patent: Nov. 13, 2018

(54) SENSE OPERATION FLAGS IN A MEMORY DEVICE

(71) Applicant: MICRON TECHNOLOGY, INC., Boise, ID (US)

(72) Inventors: Shafqat Ahmed, San Jose, CA (US); Khaled Hasnat, San Jose, CA (US); Pranav Kalavade, San Jose, CA (US); Krishna Parat, Palo Alto, CA (US); Aaron Yip, Los Gatos, CA (US); Mark A. Helm, Santa Cruz, CA (US); Andrew Bicksler, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 219 days.

(21) Appl. No.: 15/342,287

(22) Filed: Nov. 3, 2016

(65) Prior Publication Data

US 2017/0075613 A1 Mar. 16, 2017

Related U.S. Application Data

(62) Division of application No. 14/833,175, filed on Aug. 24, 2015, now Pat. No. 9,519,582, which is a division (Continued)

(51) Int. Cl.
*G06F 3/06* (2006.01)
*G11C 16/04* (2006.01)
(Continued)

(52) U.S. Cl.
CPC ............ *G06F 3/0625* (2013.01); *G06F 3/061* (2013.01); *G06F 3/0653* (2013.01); *G06F 3/0665* (2013.01); *G06F 3/0688* (2013.01); *G06F 3/0689* (2013.01); *G06F 12/0804* (2013.01); *G06F 12/0846* (2013.01); (Continued)

(58) Field of Classification Search
CPC ...... G06F 3/061; G06F 3/0625; G06F 3/0653; G06F 3/0665; G06F 3/0688; G06F 3/0689; G06F 12/0804; G06F 12/0846; G06F 13/28; G06F 2212/2022; G06F 2212/224; G06F 2212/461; G11C 16/0483; G11C 16/24; G11C 16/26; Y02D 10/14
See application file for complete search history.

(56) References Cited

U.S. PATENT DOCUMENTS 5,603,001 A * 2/1997 Sukegawa ............ G06F 3/0601
711/103
5,996,041 A 11/1999 Kim
(Continued)

*Primary Examiner* — Larry T Mackall
(74) *Attorney, Agent, or Firm* — Dicke, Billig & Czaja, PLLC

(57) ABSTRACT

In a memory device, odd bit lines of a flag memory cell array are connected with a short circuit to a dynamic data cache. Even bit lines of the flag memory cell array are disconnected from the dynamic data cache. When an even page of a main memory cell array is read, the odd flag memory cells, comprising flag data, are read at the same time so that it can be determined whether the odd page of the main memory cell array has been programmed. If the flag data indicates that the odd page has not been programmed, threshold voltage windows can be adjusted to determine the states of the sensed even memory cell page.

15 Claims, 7 Drawing Sheets

Related U.S. Application Data of application No. 12/942,152, filed on Nov. 9, 2010, now Pat. No. 9,135,998.

(51) Int. Cl.
| | | |
|---|---|---|
| *G11C 16/24* | (2006.01) | |
| *G11C 16/26* | (2006.01) | |
| *G06F 12/0804* | (2016.01) | |
| *G06F 13/28* | (2006.01) | |
| *G06F 12/0846* | (2016.01) | |

(52) U.S. Cl.
CPC .......... *G06F 13/28* (2013.01); *G11C 16/0483* (2013.01); *G11C 16/24* (2013.01); *G11C 16/26* (2013.01); *G06F 2212/2022* (2013.01); *G06F 2212/224* (2013.01); *G06F 2212/461* (2013.01); *Y02D 10/14* (2018.01)

(56) References Cited

U.S. PATENT DOCUMENTS

| | | |
|---|---|---|
| 6,002,858 A | 12/1999 | Bernard |
| 7,099,194 B2 | 8/2006 | Tu et al. |
| 7,215,575 B2 | 5/2007 | Chen et al. |
| 7,742,339 B2 | 6/2010 | Rizel et al. |
| 2007/0153583 A1 | 7/2007 | Guterman |
| 2007/0183202 A1* | 8/2007 | Yip .................... G11C 16/0483 365/185.17 |
| 2007/0260817 A1* | 11/2007 | Ha ...................... G11C 11/5642 711/118 |
| 2008/0285341 A1 | 11/2008 | Moschiano et al. |
| 2009/0003073 A1 | 1/2009 | Rizel et al. |
| 2011/0044101 A1 | 2/2011 | Chou et al. |

\* cited by examiner

SENSE OPERATION FLAGS IN A MEMORY DEVICE

RELATED APPLICATION

This application is a divisional of application Ser. No. 14/833,175, filed Aug. 24, 2015, and issued as U.S. Pat. No. 9,519,582, which is a divisional of application Ser. No. 12/942,152, filed Nov. 9, 2010 and issued as U.S. Pat. No. 9,135,998 on Sep. 15, 2015, which applications are commonly assigned and incorporated in their entirety herein by reference.

TECHNICAL FIELD

The present embodiments relate generally to memory and a particular embodiment relates to sensing operations in a memory.

BACKGROUND

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, flash drives, digital cameras, and cellular telephones. Program code and system data such as a basic input/output system (BIOS) are typically stored in flash memory devices for use in personal computer systems.

A typical flash memory device is a type of memory in which the array of memory cells is typically organized into memory blocks that can be erased and reprogrammed on block-by-block basis instead of one byte at a time. Changes in a threshold voltage of each of the memory cells, through erasing or programming of a charge storage structure (e.g., floating gate or charge trap) or other physical phenomena (e.g., phase change or polarization), determine the data value of each cell. The data in a cell of this type is determined by the presence or absence of the charge in the charge storage structure.

The memory array can be organized in many different architectures including NAND and NOR. In a NAND architecture memory device, the memory blocks can be organized as series strings of memory cells, such as illustrated in FIG. 1.

The array comprises an array of non-volatile memory cells 101 arranged in columns such as series strings 104, 105. The cells 101 are coupled drain to source in each series string 104, 105. An access line (e.g., word line) WL0-WL31 that spans across multiple series strings 104, 105 is coupled to the control gates of each memory cell in a row in order to bias the control gates of the memory cells in the row. Data lines, such as even/odd bit lines BL_E, BL_O, are coupled to the series strings and eventually coupled to sense circuitry, as described subsequently, that detect the state of each cell by sensing current or voltage on a selected bit line.

Each series string 104, 105 of memory cells is coupled to a source line 106 by a source select gate 116, 117 and to an individual bit line BL_E, BL_O by a drain select gate 112, 113. The source select gates 116, 117 are controlled by a source select gate control line SG(S) 118 coupled to their control gates. The drain select gates 112, 113 are controlled by a drain select gate control line SG(D) 114.

As a result of capacitive coupling from neighboring memory cells, the threshold voltages of the memory cells in an even page (e.g., even bit line) depend on whether the memory cells of the neighboring odd page (e.g., odd bit line) have been programmed. When a sense operation is performed on an even page, the memory device does not know whether the odd page has been programmed. In order to compensate for the uncertain state of the neighboring cells, the sense operation is performed with an extra threshold voltage margin. This can result in a reduced number of read threshold voltage margins within a limited threshold voltage window.

For the reasons stated above, and for other reasons that will become apparent to those skilled in the art upon reading and understanding the present specification, there is a need in the art for a way to reduce threshold voltage windows during a sense operation.

DETAILED DESCRIPTION

Figure 1:
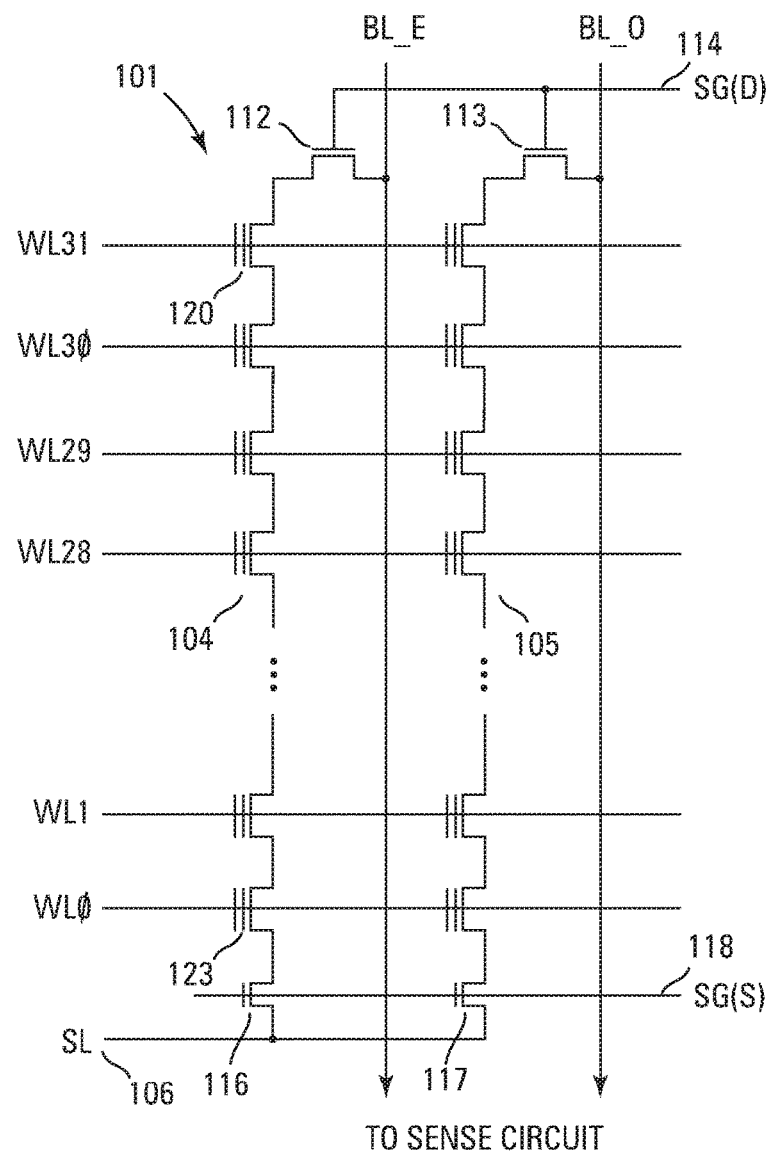
FIG. 1 shows a schematic of a portion of a typical NAND memory array.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Figure 2:
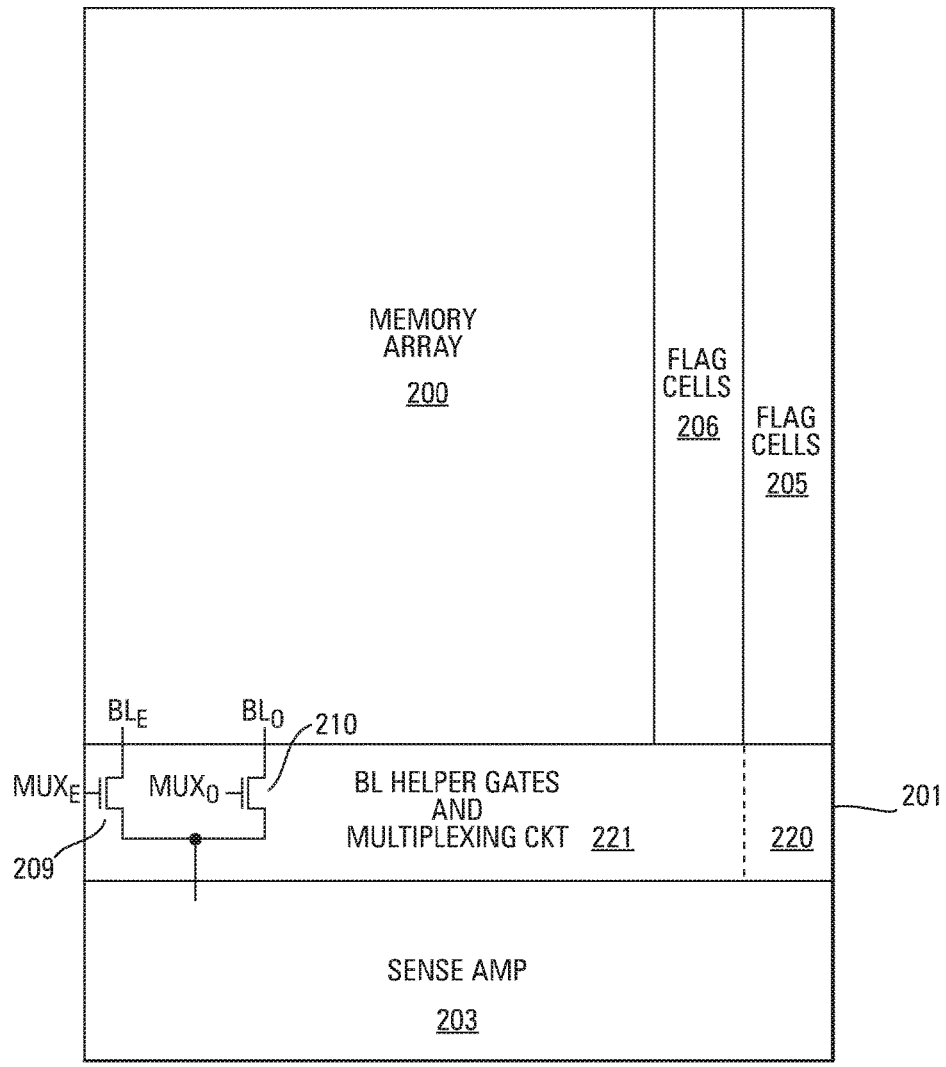
FIG. 2 shows a block diagram of one embodiment of a memory device with sense operation flags.

FIG. 2 illustrates a block diagram of one embodiment of a memory device having a main memory array 200, two sets of flag cells 205, 206, bit line helper gates and multiplexing circuit 201, and sense amplifier (e.g., dynamic data cache DDC) 203. The main memory array 200 and flag cells 205, 206 can be non-volatile memory cells such as flash memory.

The illustrated embodiment includes the main memory array 200 coupled to two flag memory cell arrays 205, 206. One flag memory cell array 206 contains flag data that are used to indicate if a page has been programmed. In one embodiment, these flag cells 206 are read when their corresponding page in the memory array is being read. In addition to other information, the flag data include an indication as to whether particular memory cells of the main memory array 200 (e.g., a particular page) is programmed, as will be described subsequently. In one embodiment, each page (where each odd or even page might also comprise more than one logical page, for example, an upper page and a lower page) of data that are stored in the memory array includes two bytes of flag data. The flag data are programmed at the same time as the programming of the data to the main memory cells.

An additional flag memory cell array 205 includes flag cells that are read when an adjacent page is being read. As will be discussed subsequently, these additional flag cells 205 are directly coupled to the sense amplifier 203 without multiplexing. The additional flag cells 205 are read concurrent with the read of an adjacent page so that it can be determined if some correction to the read voltages is necessary to account for interference or lack of interference from the adjacent page of cells. In one embodiment, the additional flag memory cell array 205 is part of the main memory array.

The main memory array 200 is coupled to the sense amplifier 203 through a multiplexing circuit 201 that includes the bit line helper gates. The bit line helper gates assist in precharging the bit lines during a sense operation.

The multiplexing circuit 201 selectively (e.g., alternatively) couples the odd and even bit lines to the sense amplifier 203. Thus, when the memory cells coupled to the odd bit lines are to be programmed or read, the multiplexing circuit 201 couples the odd bit lines to the sense amplifier 203. When the memory cells coupled to the even bit lines are to be programmed or read, the multiplexing circuit 201 couples the even bit lines to the sense amplifier 203.

FIG. 2 illustrates one embodiment for a multiplexing circuit. For example, a select transistor 209 can be coupled to the even bit line $BL_E$ and activated by a $MUX_E$ signal when the even bit lines are to be selected. Another select transistor 210 can be coupled to the odd bit line $BL_O$ and activated by a $MUX_O$ signal when the odd bit lines are to be selected.

A portion 220 of the multiplexing circuit 201 that couples the additional flag memory cell array 205 to the sense amplifier 203 is configured differently from the portion 221 of the multiplexing circuit 201 that couples the main memory array 200 to the sense amplifier 203. The additional flag memory cell array portion 220 is configured such that the odd bit lines are fixably (e.g., as opposed to selectively) coupled (e.g., directly connected) to the sense amplifier 203. In other words, the multiplexing function is inhibited for the odd bit lines so that they are fixably selected. The even bit lines are not coupled to the sense amplifier 203. In other words, the even bit lines are fixably deselected. An alternate embodiment can switch this configuration so that the even bit lines are fixably coupled to the sense amplifier 203 and the odd bit lines are fixably deselected. This configuration is shown in more detail with reference to FIG. 5 that is discussed subsequently.

The sense amplifier 203 temporarily stores data that is being written to or read from the main memory array 200, such as in order to increase the read and write speeds of the memory device. The sense amplifier 203 can include a sense amplifier circuit, a data latch, and a cache latch for memory operation. One embodiment of a sense amplifier 203 is illustrated in greater detail with reference to FIG. 3.

Figure 3:
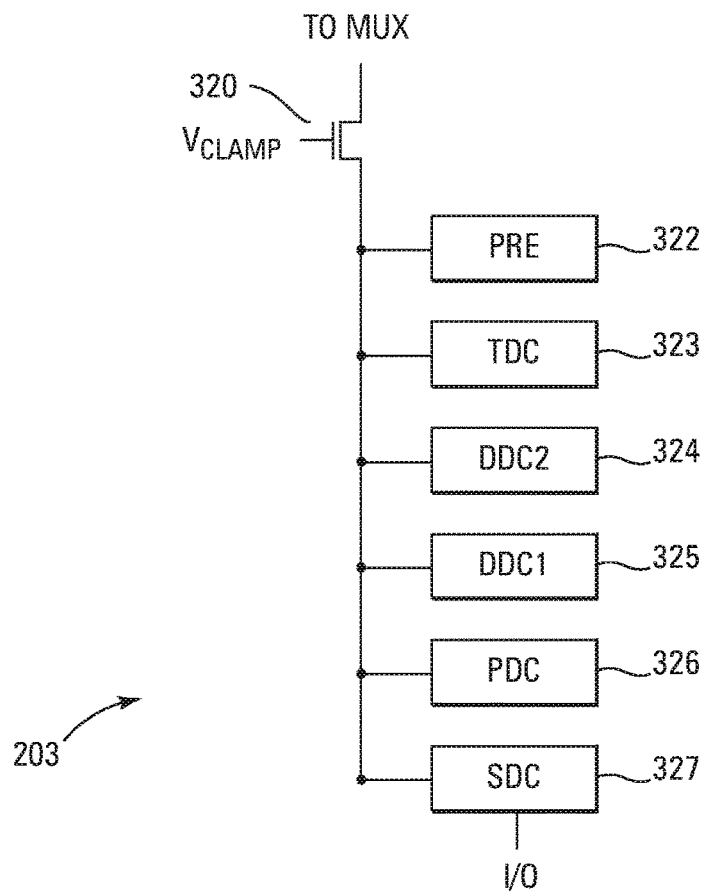
FIG. 3 shows a more detailed block diagram of one embodiment of a dynamic data cache.

FIG. 3 illustrates a block diagram of one embodiment of a sense amplifier 203 (e.g., DDC). The sense amplifier block diagram of FIG. 3 is for purposes of illustration only as alternate embodiments can use other functions/circuits in the circuit 203.

The sense amplifier 203 comprises an access transistor 320 that connects the circuit's cache circuitry to the multiplexing circuit 201 of FIG. 2. When the control signal $V_{CLAMP}$ is high, this transistor 320 turns on and connects the cache circuitry to the bit line that is selected by the multiplexing circuit 201. The NMOS access transistor 320 can be a PMOS transistor if inverse logic for the control signal $V_{CLAMP}$ is used.

The sense amplifier 203 further comprises a precharge circuit 322. When the multiplexing circuit 201 connects one of the odd or even bit lines to the sense amplifier 203, the precharge circuit 322 precharges that particular bit line prior to a sense operation.

A temporary data cache (TDC) 323 temporarily stores data during a program or sense operation. The data is stored in the TDC 323 before being moved to or after being moved from the primary data cache (PDC) 326, the secondary data cache (SDC) 327, dynamic data cache (DDC1) 325, or DDC2 324. If the present operation is a sense operation, the data in the TDC 323 is moved to the I/O line for use by external circuits such as a microprocessor that initiated the read operation. If the present operation is a program operation, the data in the TDC 323 is moved to the selected memory cell during the portion of the operation in which the selected memory cell is programmed with the data.

The main data storage portion of the sense amplifier 203 comprises a DDC2 circuit 324, a DDC1 circuit 325, a PDC circuit 326, and an SDC circuit 327. The DDC1 and DDC2 circuits 325, 324 are used for controlling multi-level programming and storing multi-level data for selected memory cells in combination with the PDC circuit 326. In an SLC programming operation, if a logical '0' is being programmed to a selected memory cell, the bit line voltage for that cell is set to 0V by the PDC 326. If a logical '1' is to be programmed, the bit line voltage is set to $V_{CC}$ from the PDC 326. A logical '1' is an erased state and means no programming is to be done, thus the $V_{CC}$ on the bit line inhibits further programming of any cells coupled to that particular bit line.

Figure 4:
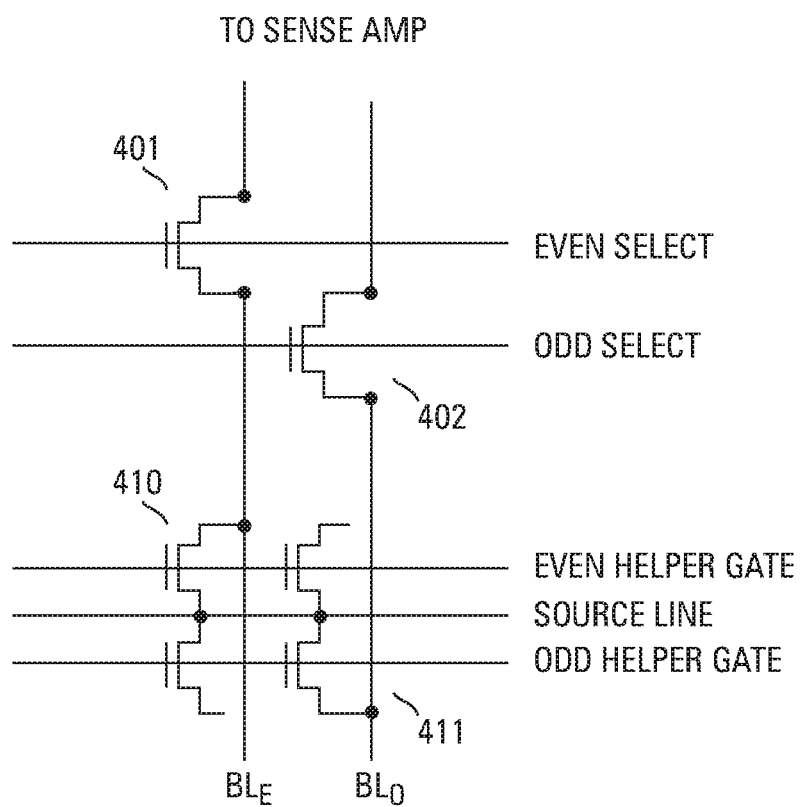
FIG. 4 shows a schematic diagram of a typical prior art multiplexing circuit.

FIG. 4 illustrates a typical prior art schematic diagram of a multiplexing circuit/helper gate circuit for coupling prior art flag cells to a sense amplifier. Since the flag memory cell array is part of and, thus, has the same architecture as the main memory array, the flag cells share the same multiplexing/helper gate circuit as the main memory array.

The schematic diagram of FIG. 4 shows that the typical prior art even and odd flag cell bit lines $BL_E$ and $BL_O$ can be selectively coupled to the sense amplifier circuitry through their respective even select transistor 401 and odd select transistor 402. An even helper gate 410 can be used to selectively couple the even bit line $BL_E$ to the source line. An odd helper gate 411 can be used to selectively couple the odd bit line $BL_O$ to the source line.

Figure 5:
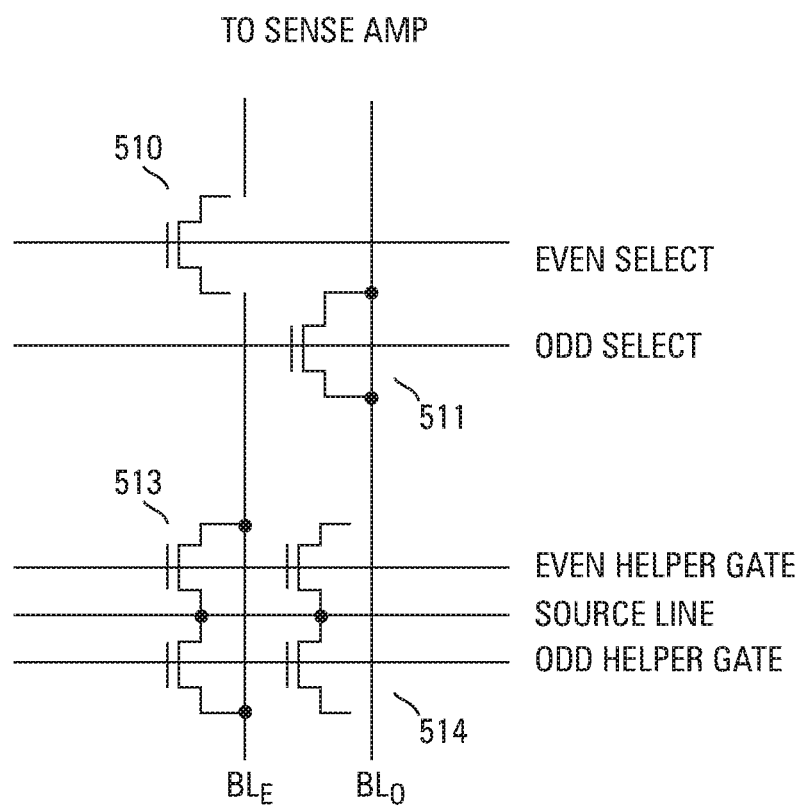
FIG. 5 shows a schematic diagram of the multiplexing circuit in accordance with FIG. 2.

FIG. 5 illustrates one embodiment of the portion of the multiplexing circuit that couples the additional flag memory cell array 205 to the sense amplifier 203. The even select gate 510 is disconnected (open circuit) from the even bit line $BL_E$ in order to fixably deselect the even bit lines. The odd select gate 511 for the odd bit lines $BL_O$ is shorted so that the odd bit lines are fixably selected. The even helper gate 513 is shorted while the odd helper gate 514 is disconnected from the odd bit lines $BL_O$.

It can be seen in FIG. 5 that the connections for the odd bit lines of the flag memory cell array effectively bypass the multiplexing circuit while the even bit lines of the flag memory cell array are not used. Thus, during a sense operation of the memory cells coupled to the even bit lines of the main memory array, the odd flags are read during the same sense operation.

Since one of the even/odd pair of bit lines is fixably deselected, one embodiment could add a set of duplicate flag memory cells to the flag memory cell array. In such an embodiment, only half of the physical flag memory cells are used for storing flag data. Thus, even though half of the flag memory cell array goes unused, the other half is always accessible during either odd or even sense operations. In one embodiment, the flag data comprise one bit to indicate whether the odd page has been programmed while the remainder of the bytes can be used to provide additional information regarding the odd page.

Figure 6:
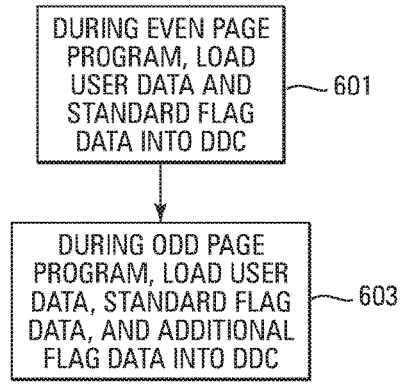
FIG. 6 shows a flowchart of one embodiment of a method for programming flag data.

FIG. 6 illustrates a flowchart of one embodiment of a method for programming the flag data into the additional flag memory cell array. During even page programming, user data are loaded into the sense amplifier (e.g., DDC) along with the standard flag data 601. Programming of the memory is then executed. During odd page programming, user data and standard flag data are loaded into the DDC. The additional flag data that indicates that the odd page is now programmed is also loaded into the DDC at this time 603. Programming of the memory is then executed.

Figure 7:
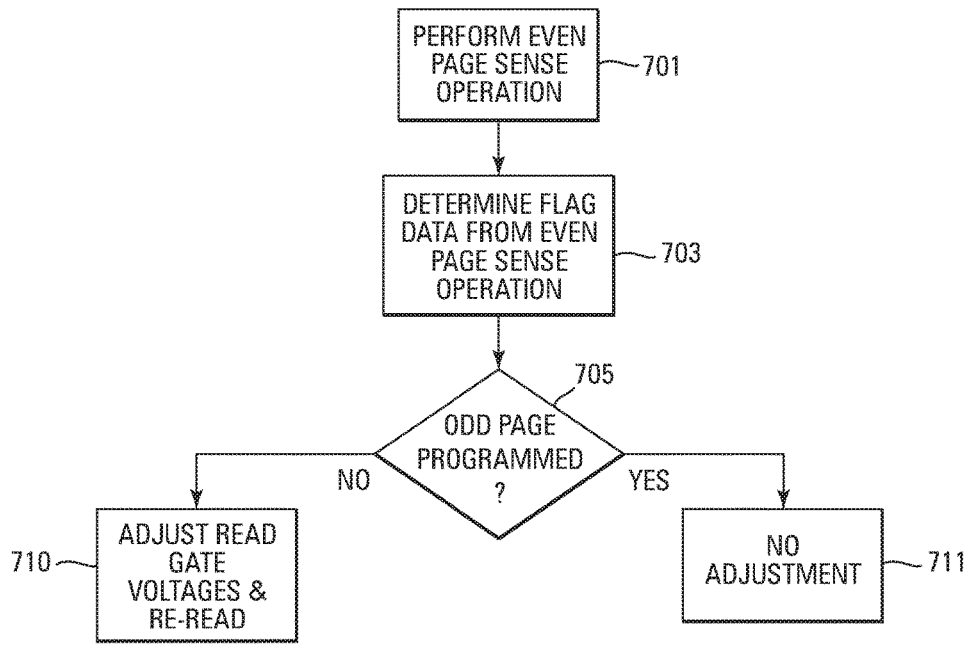
FIG. 7 shows a flowchart of one embodiment of a method for reading.

FIG. 7 illustrates a flowchart of one embodiment of a method for reading a memory array. The even page of data is read by a sense operation 701. This sense operation includes the odd page flag data 703 from the additional flag memory cell array along with the user data in the even page from the main memory cell array.

The memory control circuitry can then determine whether to adjust the read gate voltage and, thus, the threshold voltage window, in response to the odd page flag data 705. If the flag data indicates that the odd page has been programmed, the capacitive coupling from that programming has already affected the even page and additional adjustments to the read gate voltage for each state of the even page are probably not necessary 711. If the flag data indicates that the odd page has not been programmed, the read gate voltages can be adjusted (e.g., decreased) to compensate for the lack of capacitive coupling and the memory cells are re-read 710 at the new read voltage.

In an alternate embodiment, the read gate voltages can be adjusted (e.g., increased) to compensate for no coupling between the odd page and the even page and the even page can be re-read at the new read voltage. In other words, an initial sense operation is performed. If it is determined from the odd page flag data that the odd page has been programmed, the read gate voltage can be adjusted (e.g., increased) to compensate for the capacitive coupling.

In another alternate embodiment, the helper gates are coupled to decoding signals that are separate from the main memory array. During programming, the gate signals are the same as the main memory array gate signals so that the additional flag array bits are programmed when the odd page is programmed. During a read, the gate signals to the additional flag array are inversed so that the odd flag bits will be read during the even page read.

While the method of FIG. 7 refers to sensing an even page of data (e.g., even bit line) while also sensing the odd additional flag data, the same technique can be used in an alternate embodiment prior to programming of an upper page of data. As discussed previously, each odd or even page can include logical pages such as an upper page of data and a lower page of data. The additional flag data can be sensed prior to programming of the upper page on the even page, for example, to verify that the lower page is read correctly even in the absence (or presence, in an alternate embodiment) of capacitive coupling from neighboring pages. Similarly, the same technique could use even page additional flag data during an odd page sense operation if the order of sensing the even/odd pages were reversed.

Figure 8:
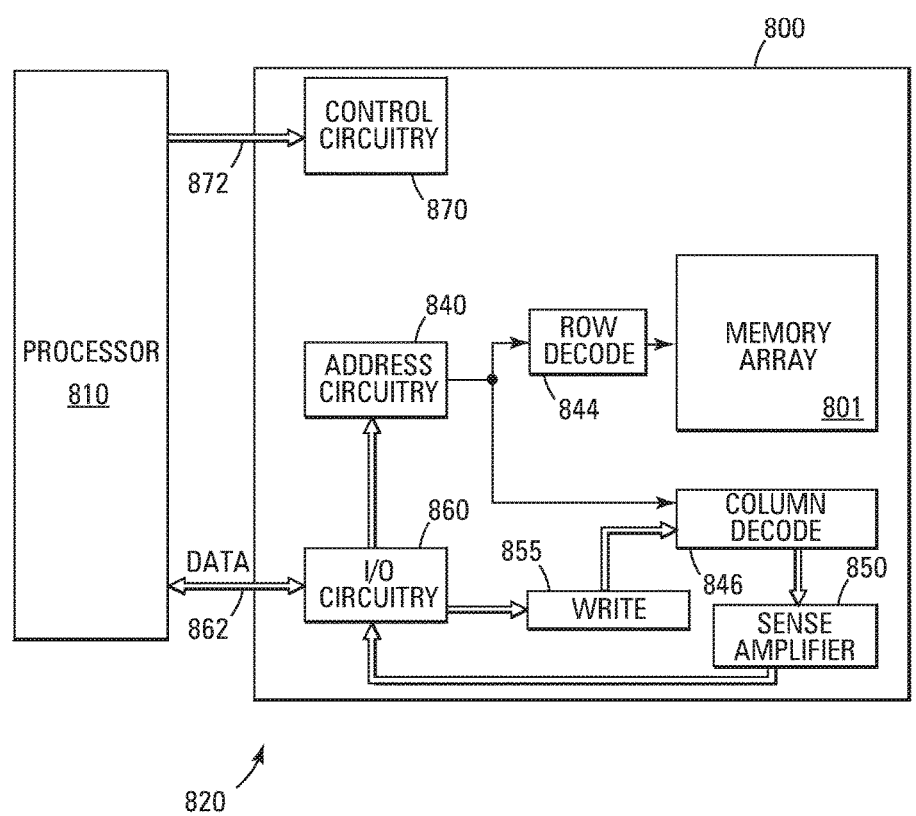
FIG. 8 shows a block diagram of one embodiment of a memory system that can incorporate the multiplexing circuit of FIGS. 2 and 5.

FIG. 8 illustrates a functional block diagram of a memory device 800. The memory device 800 is coupled to an external processor 810. The processor 810 may be a microprocessor or some other type of controller. The memory device 800 and the processor 810 form part of a memory system 820. The memory device 800 has been simplified to focus on features of the memory that are helpful in understanding the present embodiments.

The memory device 800 includes an array 830 of memory cells (e.g., non-volatile memory cells). The memory array 830 is arranged in banks of word line rows and bit line columns. In one embodiment, the columns of the memory array 830 comprise series strings of memory cells.

Address buffer circuitry 840 is provided to latch address signals provided through I/O circuitry 860. Address signals are received and decoded by a row decoder 844 and a column decoder 846 to access the memory array 830. It will be appreciated by those skilled in the art with the benefit of the present description that the number of address input connections depends on the density and architecture of the memory array 830. That is, the number of addresses increases with both increased memory cell counts and increased bank and block counts.

The memory device 800 reads data in the memory array 830 by sensing voltage or current changes in the memory array columns using sense amplifier circuitry 850. The sense amplifier circuitry 850, in one embodiment, is coupled to read and latch a row of data from the memory array 830. Data input and output buffer circuitry 860 is included for bidirectional data communication as well as the address communication over a plurality of data connections 862 with the controller 810. Write circuitry 855 is provided to write data to the memory array.

Memory control circuitry 870 decodes signals provided on control connections 872 from the processor 810. These signals are used to control the operations on the memory array 830, including data read, data write (program), and erase operations. The memory control circuitry 870 may be a state machine, a sequencer, or some other type of controller to generate the memory control signals. In one embodiment, the memory control circuitry 870 is configured to control reading and programming of memory cells including the programming and reading of the flag memory cell array.

The memory device illustrated in FIG. 8 has been simplified to facilitate a basic understanding of the features of the memory. A more detailed understanding of internal circuitry and functions of flash memories are known to those skilled in the art.

CONCLUSION

In summary, one or more embodiments additional flag cells, beyond the standard flag cells, provide an indication of whether or not a particular page of data of a memory array has been programmed. The additional flag data can be read substantially simultaneously with a previous sense operation so that it can be determined whether the read voltages for each state need to be adjusted and the memory re-read. In one embodiment, the read gate voltages are adjusted in response to the adjacent page being programmed. In another embodiment, the read gate voltages are adjusted in response to the adjacent page not being programmed. Multilevel memory cells can thus be provided with additional threshold voltage margin between states.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for programming sense flags, the method comprising:
    programming memory cells coupled to first data lines in a main memory array;
    programming memory cells coupled to second data lines in the main memory array while programming memory cells coupled to data lines in a flag memory array with flag data indicative of the memory cells coupled to the second data lines being programmed; and
    loading user data into a dynamic data cache coupled to the first data lines prior to programming the memory cells coupled to the first data lines;
    wherein programming the memory cells coupled to the first data lines in the main memory array comprises programming the memory cells coupled to the first data lines in the main memory array with the user data loaded into the dynamic data cache; and
    wherein the flag memory array is a first flag memory array, and further comprising programming memory cells coupled to data lines in a second flag memory array with other flag data while programming the memory cells coupled to the first data lines.

2. The method of claim 1, further comprising loading the other flag data into a portion of the dynamic data cache coupled to the data lines in the second flag memory array while loading the user data into the dynamic data cache.

3. The method of claim 1, wherein programming the memory cells coupled to the data lines in the flag memory array comprises programming data that includes both the flag data and other data associated with a particular page of data of the main memory array.

4. The method of claim 1, wherein the flag data comprises a plurality of bytes of data.

5. A method for programming sense flags, the method comprising:
    programming memory cells coupled to first data lines in a main memory array; and
    programming memory cells coupled to second data lines in the main memory array while programming memory cells coupled to data lines in a flag memory array with flag data indicative of the memory cells coupled to the second data lines being programmed;
    wherein the flag data comprises a plurality of bytes of data; and
    wherein the plurality of bytes of data comprises a bit indicative of the memory cells coupled to the second data lines being programmed and bytes providing additional information about the memory cells coupled to the second data lines.

6. The method of claim 5, wherein a first data line of the first data lines in the main memory array and a second data line of the second data lines in the main memory array are adjacent first and second data lines.

7. The method of claim 6, wherein a read gate voltage of the memory cell coupled to the first data line of the adjacent first and second data lines is to be adjusted in response to the flag data indicative of the memory cell coupled to the second data line of the adjacent first and second data lines being programmed.

8. A method for programming sense flags, the method comprising:
    programming memory cells coupled to first data lines in a main memory array; and
    programming memory cells coupled to second data lines in the main memory array while programming memory cells coupled to data lines in a flag memory array with flag data indicative of the memory cells coupled to the second data lines being programmed;
    wherein a first data line of the first data lines in the main memory array and a second data line of the second data lines in the main memory array are adjacent first and second data lines; and
    wherein the flag data indicative of the memory cell coupled to the second data line of the adjacent first and second data lines being programmed is to be read concurrently with the memory cell coupled to the first data line of the adjacent first and second data lines.

9. A method for programming sense flags, the method comprising:
    programming memory cells coupled to first data lines in a main memory array;
    programming memory cells coupled to second data lines in the main memory array while programming memory cells coupled to first data lines in a flag memory array with flag data indicative of the memory cells coupled to the second data lines being programmed; and
    inhibiting memory cells coupled to third data lines in the main memory array while programming memory cells coupled to third data lines in the flag memory array with flag data indicative of the memory cells coupled to the third data lines not being programmed;
    wherein a third data line of the third data lines in the main memory array and a first data line of the first data lines in the main memory array are adjacent first and third data lines; and
    wherein the flag data indicative of the memory cell coupled to the third data line of the adjacent first and third data lines not being programmed is to be read concurrently with the memory cell coupled to the first data line of the adjacent first and third data lines.

10. The method of claim 9, wherein a read gate voltage of the memory cell coupled to the first data line of the adjacent first and third data lines is to be adjusted in response to the flag data indicative of the memory cell coupled to the third data line of the adjacent first and third data lines not being programmed.

11. A method for programming sense flags, the method comprising:
    programming memory cells coupled to first data lines in a main memory array;
    programming memory cells coupled to second data lines in the main memory array while programming memory cells coupled to first data lines in a flag memory array with flag data indicative of the memory cells coupled to the second data lines being programmed; and
    inhibiting memory cells coupled to third data lines in the main memory array while programming memory cells coupled to third data lines in the flag memory array with flag data indicative of the memory cells coupled to the third data lines not being programmed;
    wherein a first first data line of the first data lines in the main memory array and a third data line of the third data lines in the main memory array are adjacent first and third data lines;
    wherein a second first data line of the first data lines in the main memory array and a second data line of the second data lines in the main memory array are adjacent second first and second data lines; and
wherein a read gate voltage of the memory cell coupled to the first first data line of the adjacent first first and third data lines is to be adjusted, in response to the flag data indicative of the memory cell coupled to the third data line of the adjacent first first and third data lines not being programmed, differently than a read gate voltage of the memory cell coupled to the second first data line of the adjacent second first and second data lines is to be adjusted in response to the flag data indicative of the memory cell coupled to the second data line of the adjacent second first and second data lines being programmed.

12. A method for programming sense flags, the method comprising:
programming memory cells coupled to first data lines in a main memory array with first user data while programming memory cells coupled to first data lines in a first flag memory array with first flag data; and
programming memory cells coupled to second data lines in the main memory array with second user data while programming memory cells coupled to second data lines in the first flag memory array with second flag data and while programming memory cells coupled to data lines in a second flag memory array with third flag data indicative of the memory cells coupled to the second data lines being programmed.

13. The method of claim 12, wherein the data lines in the second flag memory array are first data lines in the second flag memory array, and further comprising inhibiting memory cells coupled to third data lines in the main memory array while programming memory cells coupled to second data lines in the second flag memory array with flag data indicative of the memory cells coupled to the third data lines not being programmed.

14. The method of claim 12, further comprising, after programming the memory cells coupled to the first data lines in the main memory array with the first user data while programming the memory cells coupled to the first data lines in the first flag memory array with the first flag data, loading the second and third flag data in a data cache coupled to the first and second data lines in the main memory array, the first and second data lines in the first flag memory array, and the data lines in the second flag memory array while the loading the second user data in the data cache.

15. The method of claim 14, wherein
programming the memory cells coupled to the second data lines in the main memory array with the second user data comprises programming the memory cells coupled to the second data lines in the main memory array with the second user data loaded in the data cache;
programming the memory cells coupled to the second data lines in the first flag memory array with the second flag data comprises programming the memory cells coupled to the second data lines in the first flag memory array with the second flag data loaded in the data cache; and
programming the memory cells coupled to the data lines in the second flag memory array with the third flag data comprises programming the memory cells coupled to the data lines in the second flag memory array with the third flag data loaded in the data cache.

* * * * *